(12) United States Patent
Fujita et al.

(10) Patent No.: US 11,912,621 B2
(45) Date of Patent: *Feb. 27, 2024

(54) WAVELENGTH CONVERSION MEMBER, AND LIGHT EMITTING DEVICE USING SAME

(71) Applicant: NIPPON ELECTRIC GLASS CO., LTD., Otsu (JP)

(72) Inventors: Naoki Fujita, Otsu (JP); Takashi Murata, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/095,007

(22) Filed: Jan. 10, 2023

(65) Prior Publication Data

US 2023/0159375 A1 May 25, 2023

Related U.S. Application Data

(63) Continuation of application No. 17/232,426, filed on Apr. 16, 2021, now Pat. No. 11,584,682, which is a continuation of application No. 16/091,115, filed as application No. PCT/JP2017/021377 on Jun. 8, 2017, now Pat. No. 11,034,609.

(30) Foreign Application Priority Data

Jun. 27, 2016 (JP) ................. 2016-126536

(51) Int. Cl.
| | |
|---|---|
| C03C 4/12 | (2006.01) |
| C03C 3/066 | (2006.01) |
| C03C 3/078 | (2006.01) |
| C03C 3/087 | (2006.01) |
| C03C 3/093 | (2006.01) |
| C03C 3/089 | (2006.01) |
| C09K 11/72 | (2006.01) |
| C03C 3/064 | (2006.01) |
| C03C 3/085 | (2006.01) |
| H01L 33/50 | (2010.01) |
| C03C 3/083 | (2006.01) |
| C09K 11/61 | (2006.01) |
| C03C 3/062 | (2006.01) |
| C03C 3/091 | (2006.01) |
| C09K 11/00 | (2006.01) |
| G02B 5/20 | (2006.01) |
| C09K 11/64 | (2006.01) |

(Continued)

(52) U.S. Cl.
CPC ............... *C03C 4/12* (2013.01); *C03C 3/062* (2013.01); *C03C 3/064* (2013.01); *C03C 3/066* (2013.01); *C03C 3/078* (2013.01); *C03C 3/083* (2013.01); *C03C 3/085* (2013.01); *C03C 3/087* (2013.01); *C03C 3/089* (2013.01); *C03C 3/091* (2013.01); *C03C 3/093* (2013.01); *C03C 3/095* (2013.01); *C03C 3/097* (2013.01); *C09K 11/00* (2013.01); *C09K 11/61* (2013.01); *C09K 11/64* (2013.01); *C09K 11/72* (2013.01); *C09K 11/7718* (2013.01); *C09K 11/7731* (2013.01); *C09K 11/7733* (2013.01); *C09K 11/77348* (2021.01); *C09K 11/77747* (2021.01); *F21K 9/64* (2016.08); *G02B 5/20* (2013.01); *H01L 33/50* (2013.01); *H01L 33/502* (2013.01); *C03C 2201/3423* (2013.01); *C03C 2201/3447* (2013.01); *F21S 41/141* (2018.01); *F21S 41/16* (2018.01)

(58) Field of Classification Search
CPC .......... C09K 11/77348; C09K 11/7736; C09K 11/7733; C09K 11/61; C09K 11/64; C09K 11/72; C09K 11/7718; F21V 9/64; C03C 4/12; C03C 3/062; C03C 3/064; C03C 3/066; C03C 3/018; C03C 3/083; C03C 3/085; C03C 3/087; C03C 3/089; C03C 3/095; C03C 3/097; G02B 5/20; H01L 33/502; F21S 41/16; F21S 41/141

See application file for complete search history.

(56) References Cited

U.S. PATENT DOCUMENTS

| | | | | |
|---|---|---|---|---|
| 11,034,609 B2 * | 6/2021 | Fujita | ...................... | C03C 3/089 |
| 11,254,862 B2 * | 2/2022 | Fujita | ...................... | C03C 14/00 |
| 11,584,682 B2 * | 2/2023 | Fujita | ...................... | C09K 11/00 |

FOREIGN PATENT DOCUMENTS

| | | | |
|---|---|---|---|
| JP | 2006-202726 | * | 8/2006 |
| JP | 2006-202726 A | | 8/2006 |

(Continued)

OTHER PUBLICATIONS

Fujita et al., "Wavelength Conversion Member, and Light Emitting Device Using Same", U.S. Appl. No. 17/232,426, filed Apr. 16, 2021.

(Continued)

*Primary Examiner* — C Melissa Koslow
(74) *Attorney, Agent, or Firm* — Keating & Bennett, LLP

(57) ABSTRACT

Provided is a wavelength conversion member that is less decreased in luminescence intensity with time by irradiation with light of an LED or LD and a light emitting device using the wavelength conversion member. A wavelength conversion member is formed of an inorganic phosphor dispersed in a glass matrix, wherein the glass matrix contains, in % by mole, 30 to 85% $SiO_2$, 0 to 20% $B_2O_3$, 0 to 25% $Al_2O_3$, 0 to 3% $Li_2O$, 0 to 3% $Na_2O$, 0 to 3% $K_2O$, 0 to 3% $Li_2O+Na_2O+K_2O$, 0 to 35% MgO, 0 to 35% CaO, 0 to 35% SrO, 0 to 35% BaO, 0.1 to 45% MgO+CaO+SrO+BaO, and 0 to 4% ZnO, and the inorganic phosphor is at least one selected from the group consisting of an oxide phosphor, a nitride phosphor, an oxynitride phosphor, a chloride phosphor, an oxychloride phosphor, a halide phosphor, an aluminate phosphor, and a halophosphate phosphor.

7 Claims, 1 Drawing Sheet

(51) Int. Cl.
*C09K 11/77* (2006.01)
*F21K 9/64* (2016.01)
*C03C 3/095* (2006.01)
*C03C 3/097* (2006.01)
*F21S 41/16* (2018.01)
*F21S 41/141* (2018.01)

(56) References Cited

FOREIGN PATENT DOCUMENTS

| | | |
|---|---|---|
| JP | 2007-023267 A | 2/2007 |
| JP | 2011-222751 A | 11/2011 |
| JP | 2013-095849 A | 5/2013 |

OTHER PUBLICATIONS

Official Communication issued in corresponding Chinese Patent Application No. 201780039736.1, dated Aug. 10, 2023.

* cited by examiner

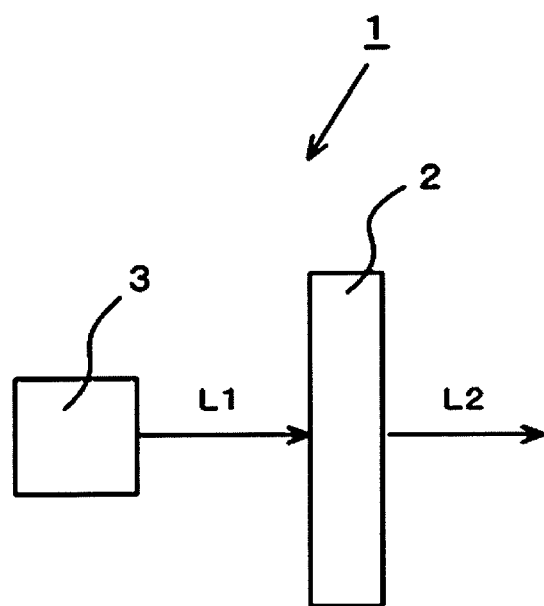

WAVELENGTH CONVERSION MEMBER, AND LIGHT EMITTING DEVICE USING SAME

TECHNICAL FIELD

The present invention relates to wavelength conversion members for converting the wavelength of light emitted from a light emitting device, such as a light emitting diode (LED) or a laser diode (LD) to another wavelength.

BACKGROUND ART

Recently, attention has been increasingly focused on light sources using LEDs or LDs, as next-generation light sources to replace fluorescence lamps and incandescent lamps, from the viewpoint of their low power consumption, small size, light weight, and easy control of light intensity. For example, Patent Literature 1 discloses, as an example of such a next-generation light source, a light source in which a wavelength conversion member is disposed on an LED for emitting a blue light and absorbs part of the light from the LED to convert it to a yellow light. This light source emits a white light which is a synthesized light of the blue light emitted from the LED and the yellow light emitted from the wavelength conversion member.

As a wavelength conversion member, there is conventionally used a wavelength conversion member in which an inorganic phosphor is dispersed in a resin matrix. However, with the use of such a wavelength conversion member, the problem arises that the light from the LED is likely to degrade the resin and thus decrease the luminance of the light source. Particularly, there is a problem that heat or high-energy short-wavelength (blue to ultraviolet) light emitted from the LED degrades the resin matrix to cause discoloration or deformation.

To cope with this, there are proposed wavelength conversion members formed of an absolutely inorganic solid in which an inorganic phosphor is dispersed and set in a glass matrix instead of resin (see, for example, Patent Literatures 2 and 3). These wavelength conversion members have the feature that the glass serving as the matrix is less likely to be degraded by heat and irradiation light from an LED and therefore less likely to cause the problem of discoloration and deformation.

However, the wavelength conversion members described in Patent Literatures 2 and 3 have a problem that their inorganic phosphors are likely to be degraded by firing during production, thus easily deteriorating the luminance. Particularly, wavelength conversion members for use in general lightings, special lightings, and the like are required to have high color rendition and, therefore, need to use inorganic phosphors having a relatively low thermal resistance, so that the degradation of the inorganic phosphors tends to become significant. As a solution to this, a wavelength conversion member is proposed in which the softening point of a glass powder is decreased by incorporating an alkali metal oxide into the glass composition (see, for example, Patent Literature 4). This wavelength conversion member can be produced by firing at a relatively low temperature and can therefore suppress the degradation of the inorganic phosphor during firing.

CITATION LIST

Patent Literature

[PTL 1]
JP-A-2000-208815
[PTL 2]
JP-A-2003-258308
[PTL 3]
Japanese Patent No. 4895541
[PTL 4]
JP-A-2007-302858

SUMMARY OF INVENTION

Technical Problem

The wavelength conversion member described in Patent Literature 4 has a problem that its luminescence intensity is likely to decrease with time (temperature quenching). With recent further increasing output power of light sources, such as LEDs and LDs, the decrease in luminescence intensity with time becomes more and more significant.

In view of the foregoing, the present invention has an object of providing a wavelength conversion member that is less decreased in luminescence intensity with time by irradiation with light of an LED or LD and a light emitting device using the wavelength conversion member.

Solution to Problem

A wavelength conversion member according to the present invention is a wavelength conversion member formed of an inorganic phosphor dispersed in a glass matrix, wherein the glass matrix contains, in % by mole, 30 to 85% $SiO_2$, 0 to 20% $B_2O_3$, 0 to 25% $Al_2O_3$, 0 to 3% $Li_2O$, 0 to 3% $Na_2O$, 0 to 3% $K_2O$, 0 to 3% $Li_2O+Na_2O+K_2O$, 0 to 35% MgO, 0 to 35% CaO, 0 to 35% SrO, 0 to 35% BaO, 0.1 to 45% MgO+CaO+SrO+BaO, and 0 to 4% ZnO, and the inorganic phosphor is at least one selected from the group consisting of an oxide phosphor, a nitride phosphor, an oxynitride phosphor, a chloride phosphor, an oxychloride phosphor, a halide phosphor, an aluminate phosphor, and a halophosphate phosphor. Herein, "(component)+(component)+ . . . " means the total content of the components.

The inventors have found that the decrease of luminescence intensity with time in the wavelength conversion member is attributed particularly to an alkali metal component contained in the glass composition. The mechanism can be presumed as follows.

When the glass matrix containing an alkali metal element in the composition is irradiated with excitation light, electrons present in the outermost shells of oxygen ions in the glass matrix are excited by the energy of the excitation light and thus detached from the oxygen ions. Some of the detached electrons bind to alkali ions in the glass matrix to form color centers (in which case vacancies are formed at positions where the alkali ions have been detached). On the other hand, holes generated by the detachment of the electrons move in the glass matrix and some of them are trapped by the vacancies formed at the positions where the alkali ions have been detached, and form color centers. It can be considered that these color centers formed in the glass matrix serve as sources of absorption of excitation light and fluorescence to decrease the luminescence intensity of the wavelength conversion member. Furthermore, heat generated from the inorganic phosphor (heat generated due to wavelength conversion loss) tends to activate the movement of electrons, holes, and alkali ions in the glass matrix. Thus, the formation of color centers is accelerated, so that the luminescence intensity is more likely to decrease.

In the wavelength conversion member according to the present invention, the formation of color centers is suppressed by minimizing the content of alkali metal components in the glass matrix as described above. Furthermore, by minimizing the content of alkali metal components in the glass matrix, the degradation of the glass matrix with time under high temperature and high humidity conditions can also be suppressed.

The glass matrix in the wavelength conversion member according to the present invention contains an alkaline-earth oxide (MgO, CaO, SrO, BaO) as an essential component. The alkaline-earth oxide can lower the softening point of the glass matrix, unlike alkali metal ions, without having any effect on the decrease of luminescence intensity with time in the wavelength conversion member. Thus, degradation in properties of the inorganic phosphor due to firing during production can be suppressed.

In the wavelength conversion member according to the present invention, the glass matrix preferably contains, in % by mole, 30 to 85% $SiO_2$, 0 to 20% $B_2O_3$, 0 to 25% $Al_2O_3$, 0 to 3% $Li_2O$, 0 to 3% $Na_2O$, 0 to 3% $K_2O$, 0 to 3% $Li_2O+Na_2O+K_2O$, 0 to 35% MgO, 0 to 35% CaO, 0 to 35% SrO, 0 to 35% BaO, 0.1 to 45% MgO+CaO+SrO+BaO, and 0 to below 1.8% ZnO.

In the wavelength conversion member according to the present invention, the glass matrix preferably has a softening point of 600 to 1100° C.

The wavelength conversion member according to the present invention preferably contains the inorganic phosphor in an amount of 0.01 to 70% by mass.

The wavelength conversion member according to the present invention is preferably made of a sintered powder body.

A light emitting device according to the present invention includes the above-described wavelength conversion member and a light source operable to irradiate the wavelength conversion member with excitation light.

In an on-vehicle lighting according to the present invention, the above-described light emitting device is used.

The on-vehicle lighting according to the present invention is for use as a headlamp.

Advantageous Effects of Invention

The wavelength conversion member according to the present invention is less decreased in luminescence intensity with time by irradiation with light of an LED or LD. Therefore, the light emitting device in which the wavelength conversion member according to the present invention is used has excellent long-term reliability and is suitable as an on-vehicle lighting, particularly as an on-vehicle headlamp.

BRIEF DESCRIPTION OF DRAWINGS

FIG. 1 is a schematic side view of a light emitting device according to an embodiment of the present invention.

DESCRIPTION OF EMBODIMENTS

A wavelength conversion member according to the present invention is formed of an inorganic phosphor dispersed in a glass matrix. The glass matrix contains, in % by mole, 30 to 85% $SiO_2$, 0 to 20% $B_2O_3$, 0 to 25% $Al_2O_3$, 0 to 3% $Li_2O$, 0 to 3% $Na_2O$, 0 to 3% $K_2O$, 0 to 3% $Li_2O+Na_2O+K_2O$, 0 to 35% MgO, 0 to 35% CaO, 0 to 35% SrO, 0 to 35% BaO, 0.1 to 45% MgO+CaO+SrO+BaO, and 0 to 4% ZnO. The reasons why the range of the glass composition is defined as above will be described below. Note that in the following description "%" refers to "% by mole" unless otherwise specified.

$SiO_2$ is a component for forming a glass network. The content of $SiO_2$ is 30 to 85% and preferably 35 to 80%. If the content of $SiO_2$ is too small, the weather resistance and mechanical strength tend to decrease. On the other hand, if the content of $SiO_2$ is too large, the sintering temperature becomes high, so that the inorganic phosphor is likely to degrade during production of the wavelength conversion member.

$B_2O_3$ is a component for lowering the melting temperature to significantly improve the meltability. The content of $B_2O_3$ is 0 to 20% and preferably 0.1 to 18%. If the content of $B_2O_3$ is too large, the weather resistance is likely to decrease.

$Al_2O_3$ is a component for improving the weather resistance and mechanical strength. The content of $Al_2O_3$ is 0 to 25% and preferably 0.1 to 20%. If the content of $Al_2O_3$ is too large, the meltability tends to decrease.

$Li_2O$, $Na_2O$, and $K_2O$ are components for lowering the melting temperature to improve the meltability and lowering the softening point. However, if the content of these components is too large, the weather resistance is likely to decrease and the luminescence intensity is likely to decrease with time by irradiation with light of an LED or LD. Therefore, the content of $Li_2O+Na_2O+K_2O$ is 0 to 3% and preferably 0 to 2%. Furthermore, the content of each component of $Li_2O$, $Na_2O$, and $K_2O$ is 0 to 3% and preferably 0 to 2%. In incorporating $Li_2O$, $Na_2O$, and/or $K_2O$ into the composition, two or more of them, particularly all these three components, are preferably used in mixture. By doing so, the mixed alkali effect enables suppression of the decrease in luminescence intensity with time due to irradiation with light of an LED or LD.

MgO, CaO, SrO, and BaO are components for lowering the melting temperature to improve the meltability and lowering the softening point. As described previously, these components have no effect on the decrease of luminescence intensity with time in the wavelength conversion member, unlike alkali metal components. The content of MgO+CaO+SrO+BaO is 0.1 to 45%, preferably 0.1 to 40%, more preferably 0.1 to 35%, still more preferably 1 to 30%, and particularly preferably 5 to 25%. If the content of MgO+CaO+SrO+BaO is too small, the softening point is less likely to decrease. On the other hand, if the content of MgO+CaO+SrO+BaO is too large, the weather resistance is likely to decrease. The content of each component of MgO, CaO, SrO, and BaO is 0 to 35%, preferably 0.1 to 33%, and particularly preferably 1 to 30%. If the content of each of these components is too large, the weather resistance tends to decrease.

ZnO is a component for lowering the melting temperature to improve the meltability. The content of ZnO is 0 to 4%, preferably 0 to 3%, more preferably 0 to below 1.8%, and still more preferably 0.1 to 1.5%. If the content of ZnO is too large, the weather resistance tends to decrease. In addition, phase separation tends to occur to decrease the transmittance, resulting in decreased luminescence intensity.

Furthermore, in addition to the above components, various components can be contained in the composition without impairing the effects of the present invention. For example, $P_2O_5$, $La_2O_3$, $Ta_2O_5$, $TeO_2$, $TiO_2$, $Nb_2O_5$, $Gd_2O_3$, $Y_2O_3$, $CeO_2$, $Sb_2O_3$, $SnO_2$, $Bi_2O_3$, $As_2O_3$, $ZrO_2$, and so on may be contained in the composition, each in an amount of 15% or less, preferably 10% or less, particularly preferably 5% or less, and in total within a range of up to 30%. Moreover, F can be contained in the composition. Because F has the effect of lowering the softening point, the incorporation thereof in substitution for an alkali metal component becoming a contributor to formation of color centers enables suppression of the decrease in luminescence intensity with time while enabling the maintenance of low softening point. The content of F is, in % by anion, preferably 0 to 10%, more preferably 0 to 8%, and particularly preferably 0.1 to 5%.

Fe and Cr are components that decrease the visible light transmittance and thus cause a decrease in luminescence intensity. Therefore, the content of Fe is preferably not more than 1000 ppm and particularly preferably not more than 500 ppm. Furthermore, the content of Cr is preferably not more than 500 ppm and particularly preferably not more than 100 ppm. However, in order to avoid incorporation of Fe and Cr in the glass, expensive, high-purity raw materials need to be used, which easily raises the production cost. Therefore, from the viewpoint of reducing the production cost, the content of each of Fe and Cr is preferably not less than 5 ppm and particularly preferably not less than 10 ppm.

The softening point of the glass matrix is preferably 600 to 1100° C., more preferably 630 to 1050° C., and particularly preferably 650 to 1000° C. If the softening point of the glass matrix is too low, the mechanical strength and weather resistance are likely to decrease. On the other hand, if the softening point is too high, the sintering temperature accordingly becomes high, which makes the inorganic phosphor likely to degrade in the firing process during production.

The inorganic phosphor in the present invention is at least one selected from the group consisting of an oxide phosphor (including a garnet-based phosphor, such as a YAG phosphor), a nitride phosphor, an oxynitride phosphor, a chloride phosphor, an oxychloride phosphor, a halide phosphor, an aluminate phosphor, and a halophosphate phosphor. Among these inorganic phosphors, the oxide phosphor, the nitride phosphor, and the oxynitride phosphor are preferred because they have high thermal resistance and are therefore relatively less likely to degrade during firing. Note that the nitride phosphor and the oxynitride phosphor have a feature that they convert near-ultraviolet to blue excitation light to a wide wavelength range of green to red light and additionally have relatively high luminescence intensity. Therefore, the nitride phosphor and the oxynitride phosphor are effective as inorganic phosphors particularly for use in a wavelength conversion member for a white LED device. In order to prevent heat generated from the inorganic phosphor from being transferred to the glass matrix, a coating inorganic phosphor may be used. Thus, the activation of movement of electrons, holes, and alkali ions in the glass matrix can be reduced, resulting in suppressed formation of color centers. An oxide is preferred as a material for the coating. A sulfide phosphor might also be cited as a phosphor other than the above phosphors. However, the sulfide phosphor is not used in the present invention because it is likely to degrade with time and likely to decrease the luminescence intensity by reaction with the glass matrix.

Examples of the above inorganic phosphor include those having an excitation band in a wavelength range of 300 to 500 nm and a luminescence peak at a wavelength of 380 to 780 nm and particular examples include those producing luminescence in blue (with wavelengths of 440 to 480 nm), those producing luminescence in green (with wavelengths of 500 to 540 nm), those producing luminescence in yellow (with wavelengths of 540 to 595 nm), and those producing luminescence in red (with wavelengths of 600 to 700 nm).

Examples of the inorganic phosphor that produces blue luminescence upon irradiation with ultraviolet to near-ultraviolet excitation light having a wavelength of 300 to 440 nm include $(Sr, Ba)MgAl_{10}O_{17}:Eu^{2+}$ and $(Sr, Ba)_3MgSi_2O_8:Eu^{2+}$.

Examples of the inorganic phosphor that produces green fluorescence upon irradiation with ultraviolet to near-ultraviolet excitation light having a wavelength of 300 to 440 nm include: $SrAl_2O_4:Eu^{2+}$; $SrBaSiO_4:Eu^{2+}$; $Y_3(Al, Gd)_5O_{12}:Ce^{3+}$; $SrSiON:Eu^{2+}$; $BaMgAl_{10}O_{17}:Eu^{2+}$, $Mn^{2+}$; $Ba_2MgSi_2O_7:Eu^{2+}$; $Ba_2SiO_4:Eu^{2+}$; $Ba_2Li_2Si_2O_7:Eu^{2+}$; and $BaAl_2O_4:Eu^{2+}$.

Examples of the inorganic phosphor that produces green fluorescence upon irradiation with blue excitation light having a wavelength of 440 to 480 nm include $SrAl_2O_4:Eu^{2+}$, $SrBaSiO_4:Eu^{2+}$, $Y_3(Al, Gd)_5O_{12}:Ce^{3+}$, $SrSiON:Eu^{2+}$, and $\beta\text{-}SiAlON:Eu^{2+}$.

An example of the inorganic phosphor that produces yellow fluorescence upon irradiation with ultraviolet to near-ultraviolet excitation light having a wavelength of 300 to 440 nm is $La_3Si_6N_{11}:Ce^{3+}$.

Examples of the inorganic phosphor that produces yellow fluorescence upon irradiation with blue excitation light having a wavelength of 440 to 480 nm include $Y_3(Al, Gd)_5O_{12}:Ce^{3+}$ and $Sr_2SiO_4:Eu^{2+}$.

Examples of the inorganic phosphor that produces red fluorescence upon irradiation with ultraviolet to near-ultraviolet excitation light having a wavelength of 300 to 440 nm include $MgSr_3Si_2O_8:Eu^{2+}$, $Mn^{2+}$ and $Ca_2MgSi_2O_7:Eu^{2+}$, $Mn^{2+}$.

Examples of the inorganic phosphor that produces red fluorescence upon irradiation with blue excitation light having a wavelength of 440 to 480 nm include $CaAlSiN_3:Eu^{2+}$, $CaSiN_3:Eu^{2+}$, $(Ca, Sr)_2Si_5N_8:Eu^{2+}$, and $\alpha\text{-}SiAlON:Eu^{2+}$.

A plurality of types of inorganic phosphors may be used in mixture according to the wavelength range of excitation light or luminescence. For example, in providing white light by irradiation with excitation light in the ultraviolet range, respective types of inorganic phosphors that produce blue, yellow, and red fluorescences may be used in mixture.

Generally, most of inorganic phosphors have higher refractive indices than glass. If a wavelength conversion member has a large refractive index difference between its inorganic phosphor and glass matrix, excitation light is likely to be scattered at the interface between the inorganic phosphor and the glass matrix. As a result, the efficiency of irradiation to the inorganic phosphor with excitation light becomes high, so that the luminescence efficiency is likely to increase. However, if the refractive index difference between the inorganic phosphor and the glass matrix is too large, the scattering of excitation light becomes excessive, which causes a scattering loss and tends to decrease the luminescence efficiency contrariwise. In view of the above, the refractive index difference between the inorganic phosphor and the glass matrix is preferably about 0.001 to about 0.5. Furthermore, the refractive index (nd) of the glass matrix is preferably 1.45 to 1.8, more preferably 1.47 o 1.75, and still more preferably 1.48 to 1.6.

The luminescence efficiency (lm/W) of the wavelength conversion member varies depending on the type of the inorganic phosphor, the content thereof, the thickness of the wavelength conversion member, and so on. The content of the inorganic phosphor and the thickness of the wavelength conversion member may be appropriately controlled so that the luminescence efficiency becomes optimal. If the content of the inorganic phosphor is too large, the wavelength conversion member may have problems, such as: it is less likely to be sintered; it has a large porosity to thus make the inorganic phosphor less likely to be efficiently irradiated with excitation light; and the mechanical strength of the wavelength conversion member decreases. On the other hand, if the content of the inorganic phosphor is too small, a desired luminescence intensity is difficult to achieve. From these viewpoints, the content of the inorganic phosphor in the wavelength conversion member according to the present invention is preferably 0.01 to 70% by mass, more preferably 0.05 to 50% by mass, and still more preferably 0.08 to 30% by mass.

The above does not apply to a wavelength conversion member aimed at reflecting fluorescence generated in the wavelength conversion member toward the excitation light incident side thereof so that only the fluorescence is mainly extracted to the outside, but the content of the inorganic phosphor may be larger (for example, preferably 30 to 80% by mass and more preferably 40 to 75% by mass) so that the luminescence intensity is maximized.

The wavelength conversion member according to the present invention may contain, in addition to the inorganic phosphor, a light diffusing material, such as alumina, silica, and/or magnesia, in a total amount of up to 30% by mass.

The wavelength conversion member according to the present invention is preferably made of a sintered powder body. Specifically, the wavelength conversion member is preferably made of a sintered body of a mixed powder containing a glass powder and an inorganic phosphor powder. In this manner, a wavelength conversion member with an inorganic phosphor uniformly dispersed in a glass matrix can be easily produced.

The maximum particle size $D_{max}$ of the glass powder is preferably 200 μm or less, more preferably 150 μm or less, and particularly preferably 105 μm or less. The average particle size $D_{50}$ of the glass powder is preferably 0.1 μm or more, more preferably 1 μm or more, and particularly preferably 2 μm or more. If the maximum particle size $D_{max}$ of the glass powder is too large, excitation light becomes less likely to scatter in the resultant wavelength conversion member and, thus, the luminescence efficiency is likely to decrease. Furthermore, if the average particle size $D_{50}$ of the glass powder is too small, excitation light excessively scatters in the resultant wavelength conversion member, so that the luminescence efficiency is likely to decrease.

Note that in the present invention the maximum particle size $D_{max}$ and the average particle size $D_{50}$ refer to values measured by laser diffractometry.

The firing temperature of the mixed powder containing a glass powder and an inorganic phosphor powder is preferably in a range of the glass powder softening point ±150° C. and particularly preferably in a range of the glass powder softening point ±100° C. If the firing temperature is too low, the glass powder does not sufficiently fluidize, so that a dense sintered body is difficult to obtain. On the other hand, if the firing temperature is too high, the inorganic phosphor component may elute into the glass to decrease the luminescence intensity or may diffuse into the glass to color the glass and thus decrease the luminescence intensity.

The firing is preferably performed in a reduced-pressure atmosphere. Specifically, the atmosphere during firing is preferably less than $1.013 \times 10^5$ Pa, more preferably not more than 1000 Pa, and particularly preferably not more than 400 Pa. Thus, the amount of air bubbles remaining in the wavelength conversion member can be reduced. As a result, the scattering factor in the wavelength conversion member can be reduced to increase the luminescence efficiency. The whole firing process may be performed in a reduced-pressure atmosphere or, for example, only the firing process may be performed in a reduced-pressure atmosphere and the heating and cooling processes before and after the firing process may be performed in an atmosphere other than reduced-pressure atmosphere (for example, under an atmospheric pressure).

There is no particular limitation as to the shape of the wavelength conversion member according to the present invention and examples include not only members having specific shapes of their own, such as platy, columnar, hemispheric, and hemispheric dome shapes, but also coating-like sintered bodies formed on matrix surfaces of a glass substrate, a ceramic substrate or like substrates.

An antireflection film or a concavo-convex microstructure layer may be provided on the surface of the wavelength conversion member. In this way, the light reflectance at the surface of the wavelength conversion member can be reduced to improve the light extraction efficiency and thus improve the luminescence intensity.

An example of the antireflection film is a monolayer or multilayer film (dielectric multilayer film) made of an oxide, a nitride, a fluoride or the like and the film can be formed by sputtering, vapor deposition, coating, and so on. The light reflectance of the antireflection film is, in a wavelength range of 380 to 780 nm, preferably 5% or less, more preferably 4% or less, and particularly preferably 3% or less.

An example of the concavo-convex microstructure layer is a moth eye structure having a size equal to or smaller than the wavelengths of visible light. Examples of a production method for the concavo-convex microstructure layer include nanoimprint lithography and photolithography. Alternatively, the concavo-convex microstructure layer can be formed by roughening the surface of the wavelength conversion member by sandblasting, etching, polishing or the like. The surface roughness Ra of the concavo-convex structure layer is preferably 0.001 to 0.3 μm, more preferably 0.003 to 0.2 μm, and particularly preferably 0.005 to 0.15 μm. If the surface roughness Ra is too small, a desired antireflection effect is difficult to achieve. On the other hand, if the surface roughness Ra is too large, light scattering is significant, so that the luminescence intensity is likely to decrease.

FIG. 1 shows an example of an embodiment of a light emitting device according to the present invention. As shown in FIG. 1, the light emitting device 1 includes a wavelength conversion member 2 and a light source 3. The light source 3 irradiates the wavelength conversion member 2 with excitation light L1. The excitation light L1 having entered the wavelength conversion member 2 is converted to fluorescence L2 having another wavelength and emits from the opposite side of the wavelength conversion member 2 to the light source 3. At this time, synthesized light of the excitation light L1 having been not converted in wavelength and having passed through the wavelength conversion member and the fluorescence L2 may be emitted.

EXAMPLES

The present invention will be described below in further detail with reference to examples, but the present invention is not limited to the following examples.

(1) Production of Glass Powder

Tables 1 to 5 show glass powders (Samples 1 to 39) used in Examples and glass powders (Samples 40 and 41) used in Comparative Examples.

TABLE 1

|  |  | 1 | 2 | 3 | 4 | 5 | 6 | 7 | 8 | 9 | 10 |
|---|---|---|---|---|---|---|---|---|---|---|---|
| Glass | $SiO_2$ | 69 | 79.5 | 70 | 69 | 67.5 | 69 | 65 | 66 | 66.5 | 68 |
| Composition | $Al_2O_3$ | 10.5 | 10.5 | 11 | 12.5 | 12.5 | 12.5 | 17 | 9.5 | 13.5 | 10.5 |
| (% by mole) | $B_2O_3$ | 9.5 |  | 9.5 | 6 | 5.5 | 5 | 6 | 10 | 5 | 8.5 |
|  | MgO |  |  |  | 3 | 1.5 | 3.5 |  |  | 1.5 |  |
|  | CaO | 9.5 | 8 | 8 | 7 | 8.5 | 6 | 8 | 9 | 9.5 | 7 |
|  | SrO | 0.5 | 0.5 | 0.5 | 2 | 2 | 2 | 3 | 2.5 | 2 | 4 |
|  | BaO | 0.5 | 1.5 | 1 | 0.5 | 1 | 2 | 1 | 2 | 1 | 1 |
|  | ZnO |  |  |  |  | 1 |  |  |  |  | 1 |
|  | $TiO_2$ |  |  |  |  |  |  |  |  |  |  |
|  | $ZrO_2$ |  |  |  |  |  |  |  |  |  |  |
|  | $La_2O_3$ |  |  |  |  |  |  |  |  |  |  |
|  | $Nb_2O_5$ |  |  |  |  |  |  |  |  |  |  |
|  | $Gd_2O_3$ |  |  |  |  |  |  |  |  |  |  |
|  | $P_2O_5$ |  |  |  |  |  | 0.5 |  |  | 1 |  |
|  | $Sb_2O_3$ | 0.2 |  |  |  |  |  |  | 1 |  |  |
|  | $As_2O_3$ | 0.3 |  |  |  |  |  |  |  |  |  |
|  | MgO + CaO + SrO + BaO | 10.5 | 10 | 9.5 | 12.5 | 13 | 13.5 | 12 | 13.5 | 14 | 12 |
| CTE ($\times 10^{-7}$/° C.) |  | 33 | 34 | 34 | 35 | 35 | 36 | 36 | 37 | 37 | 38 |
| Density (g/cm$^3$) |  | 2.39 | 2.4 | 2.44 | 2.46 | 2.46 | 2.52 | 2.45 | 2.42 | 2.49 | 2.5 |
| Strain Point (° C.) |  | 681 | 677 | 683 | 707 | 713 | 712 | 707 | 661 | 720 | 665 |
| Annealing Point (° C.) |  | 740 | 736 | 742 | 764 | 773 | 771 | 766 | 717 | 778 | 720 |
| Softening Point (° C.) |  | 995 | 992 | 994 | 999 | 1014 | 1016 | 1013 | 958 | 1015 | 959 |
| Firing Temperature (° C.) |  | 1000 | 1000 | 1000 | 1000 | 1020 | 1020 | 1020 | 980 | 1020 | 980 |
| Weather Resistance |  | Good | Good | Good | Good | Good | Good | Good | Good | Good | Good |

TABLE 2

|  |  | 11 | 12 | 13 | 14 | 15 | 16 | 17 | 18 | 19 | 20 |
|---|---|---|---|---|---|---|---|---|---|---|---|
| Glass | $SiO_2$ | 68 | 68 | 68 | 60 | 66.5 | 67 | 66.3 | 66.5 | 67.5 | 67 |
| Composition | $Al_2O_3$ | 11 | 12.5 | 10 | 17 | 12.5 | 11 | 10 | 11 | 10.5 | 12 |
| (% by mole) | $B_2O_3$ | 9 | 6 | 9.5 | 9 | 6 | 8.5 | 10.5 | 7.5 | 7.5 | 4 |
|  | MgO |  | 1.5 |  |  | 3 |  |  | 1.5 |  | 3.5 |
|  | CaO | 7 | 8.5 | 9.5 | 8 | 9.5 | 9.5 | 10.5 | 9.5 | 10.5 | 9.5 |
|  | SrO | 4 | 1.5 | 3 | 5 | 1 | 3.5 | 2.5 | 3.5 | 3.5 | 1 |
|  | BaO | 0.8 | 2 |  | 1 | 1.5 | 0.5 |  | 0.5 | 0.5 | 3 |
|  | ZnO |  |  |  |  |  |  |  |  |  |  |
|  | $TiO_2$ |  |  |  |  |  |  |  |  |  |  |
|  | $ZrO_2$ |  |  |  |  |  |  |  |  |  |  |
|  | $La_2O_3$ |  |  |  |  |  |  |  |  |  |  |
|  | $Nb_2O_5$ |  |  |  |  |  |  |  |  |  |  |
|  | $Gd_2O_3$ |  |  |  |  |  |  |  |  |  |  |
|  | $P_2O_5$ |  |  |  |  |  |  |  |  |  |  |
|  | $Sb_2O_3$ | 0.2 |  |  |  |  |  | 0.2 |  |  |  |
|  | $As_2O_3$ |  |  |  |  |  |  |  |  |  |  |
|  | MgO + CaO + SrO + BaO | 11.8 | 13.5 | 12.5 | 14 | 15 | 13.5 | 13 | 15 | 14.5 | 17 |
| CTE ($\times 10^{-7}$/° C.) |  | 38 | 38 | 39 | 39 | 39 | 39 | 39 | 40 | 40 | 40 |
| Density (g/cm$^3$) |  | 2.5 | 2.53 | 2.45 | 2.46 | 2.52 | 2.47 | 2.46 | 2.49 | 2.48 | 2.57 |
| Strain Point (° C.) |  | 667 | 707 | 659 | 682 | 701 | 685 | 655 | 678 | 680 | 713 |
| Annealing Point (° C.) |  | 724 | 766 | 711 | 737 | 757 | 741 | 708 | 732 | 734 | 771 |
| Softening Point (° C.) |  | 966 | 1006 | 940 | 969 | 988 | 975 | 938 | 958 | 965 | 1009 |
| Firing Temperature (° C.) |  | 990 | 1020 | 960 | 990 | 1000 | 1000 | 960 | 980 | 990 | 1020 |
| Weather Resistance |  | Good | Good | Good | Good | Good | Good | Good | Good | Good | Good |

TABLE 3

|  |  | 21 | 22 | 23 | 24 | 25 | 26 | 27 | 28 | 29 | 30 |
|---|---|---|---|---|---|---|---|---|---|---|---|
| Glass | $SiO_2$ | 65.5 | 71 | 63.5 | 67.7 | 64 | 63 | 63.5 | 58.8 | 61.5 | 48.5 |
| Composition | $Al_2O_3$ | 10 | 11 | 10 | 11 | 11 | 10.3 | 9 | 10 | 4 | 3.5 |
| (% by mole) | $B_2O_3$ | 6 | 1 | 7 | 8 | 9.5 | 9 | 7 | 7.5 |  | 5 |
|  | MgO | 10.3 | 3.5 | 8.5 |  |  |  |  |  |  | 21.5 |
|  | CaO |  | 7 | 6 |  | 9 | 12.5 | 13.8 | 19 | 8.5 |  |

TABLE 3-continued

|  | 21 | 22 | 23 | 24 | 25 | 26 | 27 | 28 | 29 | 30 |
|---|---|---|---|---|---|---|---|---|---|---|
| SrO | 3.5 | 2 |  | 10.5 | 0.8 |  | 2.5 | 4.5 | 4 | 3.5 |
| BaO | 4.5 | 4.5 | 4.8 | 2.5 | 5.5 | 5 | 4 |  | 14 | 12 |
| ZnO |  |  |  |  |  |  |  |  |  |  |
| $TiO_2$ |  |  |  |  |  |  |  |  | 4 | 4 |
| $ZrO_2$ |  |  |  |  |  |  |  |  | 2 | 2 |
| $La_2O_3$ |  |  |  |  |  |  |  |  |  |  |
| $Nb_2O_5$ |  |  |  |  |  |  |  |  | 2 |  |
| $Gd_2O_3$ |  |  |  |  |  |  |  |  |  |  |
| $P_2O_5$ |  |  |  |  |  |  |  |  |  |  |
| $Sb_2O_3$ | 0.2 | 0 | 0.2 | 0.3 | 0.2 | 0.2 | 0.2 | 0.2 |  |  |
| $As_2O_3$ |  |  |  |  |  |  |  |  |  |  |
| MgO + CaO + SrO + BaO | 18.3 | 17 | 19.3 | 13 | 15.3 | 17.5 | 20.3 | 23.5 | 26.5 | 37 |
| CTE ($\times 10^{-7}$/° C.) | 41 | 42 | 43 | 43 | 44 | 47 | 49 | 55 | 66 | 69 |
| Density (g/cm³) | 2.64 | 2.63 | 2.63 | 2.65 | 2.63 | 2.65 | 2.72 | 2.66 | 3.29 | 3.27 |
| Strain Point (° C.) | 676 | 735 | 661 | 660 | 652 | 648 | 650 | 655 | 706 | 650 |
| Annealing Point (° C.) | 729 | 796 | 712 | 716 | 703 | 696 | 697 | 698 | 750 | 688 |
| Softening Point (° C.) | 952 | 1039 | 924 | 959 | 922 | 898 | 893 | 871 | 912 | 829 |
| Firing Temperature (° C.) | 970 | 1050 | 940 | 980 | 940 | 920 | 910 | 890 | 930 | 850 |
| Weather Resistance | Good | Good | Good | Good | Good | Good | Good | Good | Good | Good |

TABLE 4

|  |  | 31 | 32 | 33 | 34 | 35 | 36 | 37 | 38 |
|---|---|---|---|---|---|---|---|---|---|
| Glass | $SiO_2$ | 59.5 | 56.5 | 57 | 50.5 | 63 | 53.5 | 53.5 | 58 |
| Composition | $Al_2O_3$ | 4 | 8 | 4 | 6.5 | 1.5 | 4 | 1 | 1.5 |
| (% by mole) | $B_2O_3$ |  | 4.5 | 4.5 | 6 |  |  | 5 |  |
|  | MgO |  |  |  |  |  |  |  |  |
|  | CaO | 9 | 8.5 | 8.5 | 8.5 | 9 | 9.5 | 9.5 | 11 |
|  | SrO | 4 | 8 | 8 | 8.5 | 4 | 4 | 4 | 5 |
|  | BaO | 14.5 | 14.5 | 15 | 14 | 14 | 15.5 | 15 | 16 |
|  | ZnO |  |  |  |  |  |  |  |  |
|  | $TiO_2$ | 4.5 |  |  | 4 | 4 | 7.5 | 7.5 | 4.5 |
|  | $ZrO_2$ | 2 |  | 3 | 2 | 2 | 3.5 | 2 |  |
|  | $La_2O_3$ | 1.5 |  |  |  | 1.5 | 1 | 2.5 | 2 |
|  | $Nb_2O_5$ | 1 |  |  |  |  | 0.5 |  | 2 |
|  | $Gd_2O_3$ |  |  |  |  | 1 | 1 |  |  |
|  | $P_2O_5$ |  |  |  |  |  |  |  |  |
|  | $Sb_2O_3$ |  |  |  |  |  |  |  |  |
|  | $As_2O_3$ |  |  |  |  |  |  |  |  |
|  | MgO + CaO + SrO + BaO | 27.5 | 31 | 31.5 | 31 | 27 | 29 | 28.5 | 32 |
| CTE ($\times 10^{-7}$/° C.) |  | 70 | 73 | 74 | 74 | 75 | 76 | 78 | 82 |
| Density (g/cm³) |  | 3.37 | 3.26 | 3.37 | 3.39 | 3.52 | 3.64 | 3.61 | 3.64 |
| Strain Point (° C.) |  | 703 | 641 | 656 | 651 | 703 | 724 | 663 | 693 |
| Annealing Point (° C.) |  | 747 | 683 | 698 | 690 | 746 | 765 | 700 | 734 |
| Softening Point (° C.) |  | 905 | 843 | 856 | 835 | 900 | 909 | 833 | 876 |
| Firing Temperature (° C.) |  | 930 | 850 | 880 | 860 | 920 | 930 | 850 | 900 |
| Weather Resistance |  | Good | Good | Good | Good | Good | Good | Good | Good |

TABLE 5

|  |  | 39 | 40 | 41 |
|---|---|---|---|---|
| Glass | $SiO_2$ | 63 | 70 | 38 |
| Composition | $Al_2O_3$ | 11 | 4 |  |
| (% by mole) | $B_2O_3$ | 9.5 | 8 | 11 |
|  | MgO |  |  | 2 |
|  | CaO | 9 |  |  |
|  | SrO | 0.8 |  |  |
|  | BaO | 5.5 | 1 | 4 |
|  | ZnO |  | 4 | 7 |
|  | $Li_2O$ |  | 3 | 10 |
|  | $Na_2O$ | 1 | 6 | 6 |
|  | $K_2O$ |  | 4 | 7 |
|  | $TiO_2$ |  |  | 12 |
|  | $ZrO_2$ |  |  |  |
|  | $La_2O_3$ |  |  |  |
|  | $Nb_2O_5$ |  |  | 3 |
|  | $Gd_2O_3$ |  |  |  |
|  | $P_2O_5$ |  |  |  |
|  | $Sb_2O_3$ | 0.2 |  |  |
|  | $As_2O_3$ |  |  |  |
|  | MgO + CaO + SrO + BaO | 15.3 | 1 | 6 |
| CTE ($\times 10^{-7}$/° C.) |  | 46 | 70 | 110 |
| Density (g/cm³) |  | 2.62 | 2.51 | 3.10 |
| Strain Point (° C.) |  | 647 | 475 | 430 |
| Annealing Point (° C.) |  | 694 | 510 | 460 |
| Softening Point (° C.) |  | 912 | 690 | 540 |
| Firing Temperature (° C.) |  | 930 | 710 | 560 |
| Weather Resistance |  | Good | Good | Poor |

Raw materials were compounded to give each of the glass compositions indicated in Tables 1 to 5 and each resultant mixture was melted at 1200 to 1700° C. for one to two hours using a platinum crucible to vitrify it. The molten glass was run through between a pair of cooling rollers to form it into a film shape. The obtained film-like formed glass body was ground by a ball mill and classified, thus obtaining a glass powder having an average particle size $D_{50}$ of 2.5 μm. Each glass powder thus obtained was measured in terms of coefficient of thermal expansion, density, strain point, annealing point, softening point, and weather resistance by the following methods.

The coefficient of thermal expansion was measured as a value in a range of 30 to 380° C. using a dilatometer.

The density was measured by the Archimedes's method.

The strain point, the annealing point, and the softening point, were measured using the fiber elongation method, and respective temperatures at which the viscosity reached $10^{14.5}$ dPa·s, $10^{13.0}$ dPa·s, and $10^{7.6}$ dPa·s were employed as the respective points.

The weather resistance was evaluated in the following manner. Each glass powder was pressed into a shape in a mold to produce a columnar preform having a diameter of 1 cm and then fired at a specified firing temperature described in Tables 1 to 5, thus obtaining a columnar sintered body sample. The sample was held for 300 hours under conditions of 121° C., 95% RH, and two atmospheres using a HAST tester PC-242HSR2 manufactured by Hirayama Manufacturing Corporation and evaluated in terms of weather resistance by observing the surface thereof. Specifically, the samples having surfaces found to have no change between before and after the test as the result of observation by optical microscope (×500) were evaluated to be good as indicated by the "good", whereas the sample having a surface found to precipitate any glass component or lose its luster as the result of observation by optical microscope was evaluated to be no good as indicated by the "poor".

(2) Production of Wavelength Conversion Member

Tables 6 to 14 show Examples (Samples A-1 to A-39 and B-1 to B-39) of the present invention and Comparative Examples (A-40, A-41, B-40, and B-41).

TABLE 6

|  | A-1 | A-2 | A-3 | A-4 | A-5 | A-6 | A-7 | A-8 | A-9 | A-10 |
|---|---|---|---|---|---|---|---|---|---|---|
| Glass | 1 | 2 | 3 | 4 | 5 | 6 | 7 | 8 | 9 | 10 |
| Inorganic Phosphor | YAG |
| Glass/Inorganic Phosphor (mass ratio) | 90/10 |
| Total Flux After Light Irradiation/ Total Flux Before Light Irradiation (%) | 100 | 100 | 100 | 100 | 100 | 100 | 100 | 100 | 100 | 100 |

TABLE 7

|  | A-11 | A-12 | A-13 | A-14 | A-15 | A-16 | A-17 | A-18 | A-19 | A-20 |
|---|---|---|---|---|---|---|---|---|---|---|
| Glass | 11 | 12 | 13 | 14 | 15 | 16 | 17 | 18 | 19 | 20 |
| Inorganic Phosphor | YAG |
| Glass/Inorganic Phosphor (mass ratio) | 90/10 |
| Total Flux After Light Irradiation/ Total Flux Before Light Irradiation (%) | 100 | 100 | 100 | 100 | 100 | 100 | 100 | 100 | 100 | 100 |

TABLE 8

|  | A-21 | A-22 | A-23 | A-24 | A-25 | A-26 | A-27 | A-28 | A-29 | A-30 |
|---|---|---|---|---|---|---|---|---|---|---|
| Glass | 21 | 22 | 23 | 24 | 25 | 26 | 27 | 28 | 29 | 30 |
| Inorganic Phosphor | YAG |
| Glass/Inorganic Phosphor (mass ratio) | 90/10 |
| Total Flux After Light Irradiation/ Total Flux Before Light Irradiation (%) | 100 | 99 | 100 | 100 | 100 | 100 | 100 | 100 | 100 | 100 |

TABLE 9

|  | A-31 | A-32 | A-33 | A-34 | A-35 | A-36 | A-37 | A-38 |
|---|---|---|---|---|---|---|---|---|
| Glass | 31 | 32 | 33 | 34 | 35 | 36 | 37 | 38 |
| Inorganic Phosphor | YAG |
| Glass/Inorganic Phosphor (mass ratio) | 90/10 |
| Total Flux After Light Irradiation/ Total Flux Before Light Irradiation (%) | 100 | 100 | 100 | 100 | 100 | 100 | 100 | 100 |

TABLE 10

| Glass | B-1<br>1 | B-2<br>2 | B-3<br>3 | B-4<br>4 | B-5<br>5 | B-6<br>6 | B-7<br>7 | B-8<br>8 | B-9<br>9 | B-10<br>10 |
|---|---|---|---|---|---|---|---|---|---|---|
| Inorganic Phosphor | | | | | α-SiAlON | | | | | |
| Glass/Inorganic Phosphor (mass ratio) | | | | | 80/20 | | | | | |
| Total Flux After Light Irradiation/<br>Total Flux Before Light Irradiation (%) | 100 | 100 | 100 | 100 | 100 | 100 | 100 | 100 | 100 | 100 |

TABLE 11

| Glass | B-11<br>11 | B-12<br>12 | B-13<br>13 | B-14<br>14 | B-15<br>15 | B-16<br>16 | B-17<br>17 | B-18<br>18 | B-19<br>19 | B-20<br>20 |
|---|---|---|---|---|---|---|---|---|---|---|
| Inorganic Phosphor | | | | | α-SiAlON | | | | | |
| Glass/Inorganic Phosphor (mass ratio) | | | | | 80/20 | | | | | |
| Total Flux After Light Irradiation/<br>Total Flux Before Light Irradiation (%) | 100 | 100 | 100 | 100 | 100 | 100 | 100 | 100 | 100 | 100 |

TABLE 12

| Glass | B-21<br>21 | B-22<br>22 | B-23<br>23 | B-24<br>24 | B-25<br>25 | B-26<br>26 | B-27<br>27 | B-28<br>28 | B-29<br>29 | B-30<br>30 |
|---|---|---|---|---|---|---|---|---|---|---|
| Inorganic Phosphor | | | | | α-SiAlON | | | | | |
| Glass/Inorganic Phosphor (mass ratio) | | | | | 80/20 | | | | | |
| Total Flux After Light Irradiation/<br>Total Flux Before Light Irradiation (%) | 100 | 99 | 100 | 100 | 100 | 100 | 100 | 100 | 100 | 100 |

TABLE 13

| Glass | B-31<br>31 | B-32<br>32 | B-33<br>33 | B-34<br>34 | B-35<br>35 | B-36<br>36 | B-37<br>37 | B-38<br>38 |
|---|---|---|---|---|---|---|---|---|
| Inorganic Phosphor | | | | α-SiAlON | | | | |
| Glass/Inorganic Phosphor (mass ratio) | | | | 80/20 | | | | |
| Total Flux After Light Irradiation/<br>Total Flux Before Light Irradiation (%) | 100 | 100 | 100 | 100 | 100 | 100 | 100 | 100 |

TABLE 14

| Glass | A-39<br>39 | A-40<br>40 | A-41<br>41 | B-39<br>39 | B-40<br>40 | B-41<br>41 |
|---|---|---|---|---|---|---|
| Inorganic Phosphor | | YAG | | | α-SiAlON | |
| Glass/Inorganic Phosphor (mass ratio) | | 90/10 | | | 80/20 | |
| Total Flux After Light Irradiation/<br>Total Flux Before Light Irradiation (%) | 99.5 | 98 | 97.5 | 99 | 94 | 93 |

Each of the glass powder samples described in Tables 1 to 5 was mixed with a specified inorganic phosphor powder shown in Tables 6 to 14 at a specified mass ratio, thus obtaining a mixed powder. The mixed powder was pressed into a shape in a mold to produce a columnar preform having a diameter of 1 cm. The preform was fired and the obtained sintered body was processed, thus obtaining a 1.2-mm square, 0.2-mm thick wavelength conversion member. In relation to the firing temperature, each specified firing temperature described in Tables 1 to 5 was used according to the glass powder used.

The above wavelength conversion member was placed on an LED chip having an emission wavelength of 445 nm and energized with 650 mA, and continuously irradiated with light for 100 hours. The wavelength conversion member was measured, before and after the light irradiation, in terms of spectral energy distribution of light emitted from the top surface of the wavelength conversion member in an integrating sphere using a general-purpose emission spectral measurement device. The obtained emission spectra were multiplied by the standard relative luminous efficiency to calculate a total flux. The rate of change of total flux was represented by a value (%) obtained by dividing the total flux after the light irradiation by the total flux before the light irradiation and multiplying the result value by 100. The results are shown in Tables 6 to 14.

As seen from Tables 6 to 14, in the case where YAG was used as the inorganic phosphor, each of the wavelength conversion members A-1 to A-39 as Examples kept, even after the light irradiation for 100 hours, 99.5% or more of the total flux before the light irradiation, whereas the total flux after the light irradiation for 100 hours of each of the wavelength conversion members A-40 and A-41 as Comparative Examples decreased to 98% or less of the total flux before the light irradiation.

Furthermore, in the case where α-SiAlON was used as the inorganic phosphor, each of the wavelength conversion members B-1 to B-39 as Examples kept, even after the light irradiation for 100 hours, 99% or more of the total flux before the light irradiation, whereas the total flux after the light irradiation for 100 hours of each of the wavelength conversion members B-40 and B-41 as Comparative Examples decreased to 94% or less of the total flux before the light irradiation.

INDUSTRIAL APPLICABILITY

The wavelength conversion member according to the present invention is suitable as a component member of a general lighting or a special lighting (for example, a projector light source or an on-vehicle lighting, such as an on-vehicle headlamp), such as a white LED.

REFERENCE SIGNS LIST 1 light emitting device
2 wavelength conversion member
3 light source

The invention claimed is:

1. A wavelength conversion member formed of an inorganic phosphor dispersed in a glass matrix, wherein
the glass matrix contains, in % by mole, 30 to 85% $SiO_2$, 0 to 20% $B_2O_3$, 0 to 25% $Al_2O_3$, 0 to 3% $Li_2O$, 0 to 3% $Na_2O$, 0 to 3% $K_2O$, 0 to 3% $Li_2O+Na_2O+K_2O$, 0 to 35% MgO, 0 to 35% CaO, 0 to 35% SrO, 0 to 35% BaO, 0.1 to 45% MgO+CaO+SrO+BaO, and 0 to 4% ZnO,
the glass matrix has a softening point of 829 to 1100° C., and
the inorganic phosphor is at least one selected from the group consisting of an oxide phosphor, a nitride phosphor, an oxynitride phosphor, a chloride phosphor, an oxychloride phosphor, a halide phosphor, an aluminate phosphor, and a halophosphate phosphor.

2. The wavelength conversion member according to claim 1, wherein the glass matrix contains, in % by mole, 30 to 85% $SiO_2$, 0 to 20% $B_2O_3$, 0 to 25% $Al_2O_3$, 0 to 3% $Li_2O$, 0 to 3% $Na_2O$, 0 to 3% $K_2O$, 0 to 3% $Li_2O+Na_2O+K_2O$, 0 to 35% MgO, 0 to 35% CaO, 0 to 35% SrO, 0 to 35% BaO, 0.1 to 45% MgO+CaO+SrO+BaO, and 0 to below 1.8% ZnO.

3. The wavelength conversion member according to claim 1, containing the inorganic phosphor in an amount of 0.01 to 70% by mass.

4. The wavelength conversion member according to claim 1, being made of a sintered powder body.

5. A light emitting device comprising:
the wavelength conversion member according to claim 1; and
a light source operable to irradiate the wavelength conversion member with excitation light.

6. An on-vehicle lighting in which the light emitting device according to claim 5 is used.

7. The on-vehicle lighting according to claim 6 for use as a headlamp.

* * * * *